United States Patent
Hamers et al.

(10) Patent No.: US 6,689,858 B2
(45) Date of Patent: Feb. 10, 2004

(54) HALOGEN-MODIFIED SILICON, SURFACES

(75) Inventors: Robert J. Hamers, Madison, WI (US); Wei Cai, Madison, WI (US); Lloyd M. Smith, Madison, WI (US); Todd C. Strother, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 231 days.

(21) Appl. No.: 09/770,885

(22) Filed: Jan. 26, 2001

(65) Prior Publication Data

US 2002/0137195 A1 Sep. 26, 2002

Related U.S. Application Data

(63) Continuation-in-part of application No. 09/659,442, filed on Sep. 8, 2000, now Pat. No. 6,569,979.

(51) Int. Cl.$^7$ .......................... C08G 77/00; C07H 21/04
(52) U.S. Cl. ........................................ 528/10; 536/23.1
(58) Field of Search ............................... 435/287.2, 7.1, 435/6; 427/533; 536/23.1; 528/10; 423/89

(56) References Cited

U.S. PATENT DOCUMENTS

| | | | |
|---|---|---|---|
| 5,429,708 | A | 7/1995 | Linford et al. |
| 5,830,539 | A | 11/1998 | Yan et al. |
| 2002/0015778 | A1 | 2/2002 | Effenberger |

FOREIGN PATENT DOCUMENTS

WO    WO 01/23962 A2    4/2001

OTHER PUBLICATIONS

See IDS: Stephens et al. (1997) Solar Energy Materials and Solar Cells, vol. 45, 255–265.*
See IDS: Buriack (1999) Chem. Commun. 1051–1060.*
Arnold, B.A., Hepler, R. W. and Keller, P. M. (1998) *BioTechniques*, 25, 106–110.
Bamdad, S. (1998) *Biophysical Journal*, 75, 1997–2003.
Brockman, J. M., Frutos, A. B. and Corn, R. M. (1999) *Journal of the American Chemical Society*, 121(35), 8044–8051.
Broude, N. E., Sano, T., Smith, C. L. and Cantor, C. R. (1994) *Proc. Natl Acad. Sci. USA*, 91, 3072–3076.
Buriak, J. M. (1999) *Chem. Commun.*, 1051–1060.
Chrisey, L. A. Lee, G. and O'Ferrall, C. E. (1996) *Nucleic Acids Research*, 25, 3031–3039.
Connolly, B. A. and Rider, P. (1985) *Nucleic Acids Research*, 13, 4485–4501.
Effenberger, F., Gotz, G., Bidlingmaier, B. and Wezstein, M. (1998) *Angew. Chem. Int. Ed.*, 37(18), 2462–2464.
Frutos, A. G., Liu, Q., Thiel, A. J., Sanner, A. M. W., Condon, A. E., Smith, L. M. and Corn, R. M. (1997) *Nucleic Acids Research*, 25, 4748–4757

Frutos, A. G., Smith, L. M. and Corn, R. M. (1998) *Journal of the American Chemical Society*, 120(40), 10277–10282.
Greene, T. W. and Wuts, P. G. M. (1999) Protective Groups in Organic Synthesis, John Wiley & Sons, Inc., New York. (Copy not provided).
Guo, Z., Guilfoyle, R. A., Thiel, A. J., Wang, R. and Smith, L. M. (1994) *Nucleic Acids Research*, 22, 5456–5465.
Hamers, R. J. Hovis, J. S., Seung, L., Liu, H. and Shan, J. (1997) *The Journal of Physical Chemistry B*, 101, 1489–1492.
Hashimoto, K., Ito, K. and Ishimori, Y. (1994) *Analytical Chemistry*, 66, 3830–3833.
Henke, L., Piunno, P. A. E., McClure, A. C. Krull, U. J. (1997) *Analytica Chimica Acta*, 344, 201–213.
Kremski, J. N., Wooters, J. L., Dougherty, J. P., Meyers, R. E., Collins, M. and Brown, E. L. (1987) *Nucleic Acids Research*, 15, 2891–2909.
Lamture, J. B., Beattie, K. L., Burke, B. E., Eggers, M. D., Ehrlich, D. J., Fowler, R., Hollis, M. A., Kosicki, B. B., Reich, R. K., Smith, S. R., Varma, R. S. and Hogan, M. E. (1994) *Nucleic Acids Research*, 22, 2121–2125.
Linford, M. R., Fenter, P., Eisenberger, P. M. and Chidsey, C. E. D. (1995) *Journal of the American Chemical Society*, 117, 3145–3155.
Liu, Q., Frutos, A. G., Thiel, A. J., Corn, R. M. and Smith, L. M. (1998) *Journal of Computational Biology*, 5, 269–278.
Livache, T., Fouque, B., Roget, A., Marchand, J., Bidan, G., Teoule, R. and Mathis, G. (1998) *Analytical Biochemistry*, 255, 188–194.
Lund, V., Schmid, R., Rickwood, D. and Hornes, E. (1988) *Nucleic Acids Research*, 16, 10860–10878.
M'Saad, H., Michel, J., Lappe, J.J., and Kimerling, L.C. (1994) *Journal of Electronic Materials*, 23(5), 487–491.
Maskos, U. and Southern, E. M. (1992) *Nucleic Acids Research*, 20, 1679–1684.

(List continued on next page.)

*Primary Examiner*—Sean McGarry
*Assistant Examiner*—Janet Epps-Ford
(74) *Attorney, Agent, or Firm*—Joseph T. Leone, Esq.; DeWitt Ross & Stevens S.C.

(57) ABSTRACT

Chemically-modified surfaces on unoxidized, bromine- or iodine-terminated carbon, silicon, and germanium substrates are disclosed. Visible light mediates the reaction of protected ω-modified, α-unsaturated aminoalkenes (preferred) with bromine- or iodine-terminated carbon, silicon, or germanium surfaces. Removal of the protecting group yields an aminoalkane-modified silicon surface. These amino groups can be coupled to terminal-modified oligonucleotides using a bifunctional crosslinker, thereby permitting the preparation of modified surfaces and arrays. Methods for controlling the surface density of molecules attached to the substrate are also disclosed.

25 Claims, 8 Drawing Sheets

OTHER PUBLICATIONS

Millan, K. M., Spurmanis, A. J. and Mikkelsen, S. R. (1992) *Electroanalysis*, 4, 929–932.

Millan, K. M. and Mikkelsen, S. R. (1993) *Analytical Chemistry*, 65, 2317–2323.

Newman, H. (1965) *Journal of Organic Chemistry*, 30, 1287–1288.

Pang, D., Zhang, M., Wang, Z., Qi, Y., Cheng, J. and Liu, Z. (1996) *Journal of Electroanalytical Chemistry*, 403, 183–188.

Parinov, X., Barsky, V., Gennady, Y., Kirillov, E., Timofeev, E., Belgovkiy, A. and Mirzabekov, A. (1996) *Nucleic Acids Research*, 24, 2889–3004.

Pfister, J. R. and Wymann, W. E. (1983) *Synthesis*, 38–40.

Piunno, P. A. E., Krull, U. J., Hudson, R. H. E., Damha, M. J. and Cohen, H. (1994) *Analytica Chimica Acta*, 288, 205–214.

Rasmussen, S. R., Larsen, M. R. and Rasmussen, S. E. (1991) *Analytical Biochemistry*, 198, 138–142.

Rogers, Y., Jiang–Baucom, P., Huang, Z., Bogdanov, V., Anderson, S. and Boyce–Jacino, M. T. (1999) *Analytical Biochemistry*, 266, 23–30.

Service, R. F. (1998) *Science*, 282, 396–399.

Shchepinov, M. S., Case–Green, S. C. and Southern, E. M. (1997) *Nucleic Acids Research*, 25, 1155–1161.

Sieval, A. B., Demirel, A. L., Nissink, J. W. M., Linford, M. R., van der Mass, J. H., de Jeu, W. H., Zuilhof, H. and Sudholter, E. J. R. (1998) *Langmuir*, 14, 1759–1768.

Smith, L. M., Corn, R. M., Condon, A. E., Lagally, M. G., Frutos, A. G., Liu, Q. and Thiel, A. J. (1998) *Journal of Computational Biology*, 5, 255–267.

Souteyrand, E., Cloarec, J. P., Martin, J. R., Wilson, C., Lawrence, I., Mikkelsen, S. and Lawrence, M. F. (1997) *Journal of Physical Chemistry B*, 101, 2980–2985.

Southern, E. M., Case–Green, S. C., Johnson, M., Mir, K. U., Wang, L. and Williams, J. C. (1994) *Nucleic Acids Research*, 22, 1368–1373.

Stephens, A. W. and Green, M.A. (1997) *Solar Energy Materials and Solar Cells*, 45, 255–265.

Stewart, M. P. and Buriak, J. M. (1998) *Angew. Chem. Int. Ed.*, 37(23), 3257–3260.

Strother, T., Cai, W., Zhao, X., Hamers, R. J. and Smith, L. M. (2000) *Journal of the American Chemical Society*, 122(6), 1205–1209.

Tarbell, D.S., Yamamoto, Y. and Pope, B. M. (1972) *Proc. Nat. Acad. Sci. USA*, 69(3), 730–732.

Terry, J., Linford, M. R., Wigren, C., Cao, R., Pianetta, P. and Chidsey, C. E. D. (1999) *Journal of Applied Physics*, 85, 213–221.

Ulman, A. (1996) *Chemical Reviews*, 96, 1533–1554.

User Guide to DNA Modification (1996) Glen Research Corporation, Sterling, Virginia. (Copy not provided).

Vo–Dinh, T., Alarie, J. P., Isola, N., Landis, D., Winterberg, A. L. and Ericson, M. N. (1999) *Analytical Chemistry*, 71, 358–363.

Waddell, T. G., Leyden, D. E. and DeBello, M. T. (1981) *Journal of the American Chemical Society*, 103, 5303–5307.

Wagner, P., Nock, S., Spudich, J. A., Volkmuth, W. D., Chu, S., Cicero, R. L., Wade, C. P., Linford, M. R. and Chidsey, C. E. D. (1997) *Journal of Structural Biology*, 119, 189–201.

Wang, J., Fernandes, J. R. and Kubota, L. T. (1988) *Analytical Chemistry*, 70, 3699–3702.

Yang, M., McGovern, M. E. and Thompson, M. (1997) *Analytica Chimica Acta*, 346, 259–275.

Yang, M., Kong, R. Y. C., Kazmi, M. and Leung, K. C. (1998) *Chemistry Letters*, 257–258.

Zhao, Y., Pang, D., Wang, Z., Cheng, J. and Qi, Y. (1997) *Journal of Electroanalytical Chemistry*, 431, 203–209.

\* cited by examiner

HALOGEN-MODIFIED SILICON, SURFACES

PRIORITY

This is a Continuation-In-Part of application Ser. No. 09/659,442, filed Sep. 8, 2000, now U.S. Pat. No. 6,569,979 the entirety of which is incorporated herein by reference.

U.S. GOVERNMENT SUPPORT

This invention was made with United States government support awarded by the following agency: National Institutes of Health, Grant No. 1 R21 HG02101-01. The United States has certain rights in this invention.

FIELD OF THE INVENTION

The invention is directed to modified carbon, silicon, and germanium surfaces (including modified surfaces of alloys containing any combination of carbon, silicon and/or germanium). Specifically, the invention is directed to unoxidized, bromine- or iodine-terminated carbon, silicon, and germanium surfaces modified to have bonded thereto a linker moiety capable of anchoring various other chemical moieties to the unoxidized surface. These modified surfaces are suitable for the fabrication of surface-bound chemicals, including surfaces of bound nucleic acids and nucleic acid arrays comprising two or more such surfaces.

DESCRIPTION OF THE PRIOR ART

Surfaces suitable for the immobilization of nucleic acids have become an increasingly important biological tool in recent years. Arrays of nucleic acid molecules, either as double-stranded segments or as short, single-stranded oligonucleotides, have been utilized for drug development, genetic sequencing, medical diagnostics, nucleic acid-ligand binding studies and DNA computing.[1-21] The principal advantages of using surface-bound oligonucleotides over those in solution include ease of purification, conservation of material and reagents, reduction of interference between oligonucleotides, and facilitated sample handling.[12] Previously explored surfaces for immobilization of nucleic acids include latex beads,[5] polystyrene,[1] carbon electrodes,[22-25] gold,[17,23,26-28] and oxidized silicon or glass.[3,8,11,29-32]

The surface chemistries involved with these substrates, however, do not possess many of the desired characteristics of an ideal surface. These ideal surface characteristics include: surface flatness and homogeneity; control of surface properties; thermal and chemical stability, reproducibility; and amenability to nucleic acid immobilization and biochemical manipulation. More recently, the desire to use immobilized nucleic acid as a biosensor in integrated circuits[33] would require a surface amenable to integration into a microelectronics format. The limitations of the prior art surfaces and attachment chemistries indicate a need for alternative substrates that more closely resemble the ideal. As described herein, unoxidized crystalline carbon, silicon, and germanium, allotropes thereof, and alloys thereof offer advantages as substrates for immobilization of nucleic acids and other chemicals having similar or analogous reactivity because of their high purity, highly organized and defined crystalline structure and robustness. Silicon is particularly preferred due to its ubiquitous use in the microelectronics industry.

However, native silicon surfaces, for example, react with air under ambient conditions to form a thin surface layer of silicon oxide. This oxidized silicon surface is chemically similar to glass and suffers from some of the same drawbacks, namely inhomogeneity and variability in the relative number of Si—O—Si and Si—OH linkages. This inhomogeneity and the concomitant chemical variability it engenders can lead to difficulties in the reproducibility and homogeneity of the subsequent chemical-modified surfaces, particularly as the silane chemistry generally employed to couple to such surfaces is itself prone to stability problems and difficult-to-control polymerization processes.[34,35]

Chemical pathways for direct functionalization of silicon substrates without an oxide layer have opened up new possibilities for highly-controlled nucleic acid attachment. These new attachment methods provide modified silicon surfaces through direct carbon-silicon bonds,[19,36-42] and have resulted in methyl-, chlorine-, ester-, or acid-terminated substrates.[36,39,40,43,44] Although Wagner et al.[19] describe using an N-hydroxysuccinimidyl ester-terminated silicon surface to immobilize a 1752 bp double-stranded section of DNA, this reference does not disclose a systematic, reproducible method to produce chemically-modified silicon surfaces in general, nor nucleic acid-modified silicon surfaces in particular.

Reactions of ω-alkenes with silicon surfaces have been described in the prior art, either mediated by diacyl peroxides,[36] through UV irradiation,[19,41] or by direct thermal activation.[39] The ω-alkenes used have contained a variety of functional groups, including esters, acids,[39,44] and chlorides.[36]

The use of halogens as chemical passivating agents for silicon-based semiconductors has been described previously.[52,53]

U.S. patent application Ser. No. 09/659,442, filed Sep. 8, 2000, describes a method of creating modified carbon, silicon, and germanium surfaces. The method includes reacting a straight, branched, or cyclic alkene having a substitutent thereon with an unoxidized carbon, silicon, or germanium substrate to yield a modified substrate having bonded directly thereto, in the absence of any intervening oxygen atoms, substituted alkyl moieties. The reaction involves a hydrogen-terminated surface. The strength of a Si—H bond, however, is a good deal larger than either a Si—Br or Si—I bond. Thus, as described in this prior application (to which the subject application claims priority), a photoinitiated reaction designed to break Si—H bonds must use ultraviolet (UV) radiation. Ultra-violet irradiation, however, can damage many samples, including biological samples and other molecular systems that are sensitive to degradation by short-wave light or energetic particles.

SUMMARY OF THE INVENTION

The invention is directed to a method of creating modified carbon, silicon, and germanium surfaces comprising reacting a straight, branched, or cyclic alkene having a substitutent thereon with a bromine- or iodine-terminated carbon, silicon, or germanium substrate to yield a modified substrate having bonded directly thereto, in the absence of any intervening oxygen atoms, substituted alkyl moieties.

A preferred embodiment of the invention is directed to a method of creating modified surfaces on unoxidized, bromine- or iodine-terminated carbon, silicon, and germanium surfaces (iodine being preferred), the method comprising first reacting an amino-, carboxy-, or thiol-modified and protected alkene with a bromine- or iodine-terminated carbon, silicon, or germanium substrate to yield a surface of protected, amino-, carboxy-, or thiol-modified alkane molecules covalently bonded to the substrate in the absence of any intervening oxygen molecules. Then the modified alkane molecules of the first step are deprotected (if necessary), thereby yielding a surface of unprotected modified alkane molecules bonded to the substrate. Next, if necessary, the deprotected modified alkane molecules are reacted with a crosslinker, whereby the crosslinker is attached to the modified alkane molecules. Lastly, molecules such as nucleic acids or proteins are attached to the crosslinker of the previous step, thereby yielding a surface of molecules immobilized on the substrate.

A particularly preferred embodiment of the invention is a method of creating modified surfaces on unoxidized carbon, silicon, and germanium surfaces. The method comprises the following steps: First, reacting iodine with an unoxidized carbon, silicon, or germanium substrate to form an iodine-terminated carbon, silicon, or germanium substrate. Then placing an amino-, carboxy-, or thiol-modified alkene upon the iodine-terminated carbon, silicon, or germanium substrate. The amino-, carboxy-, or thiol-modified alkene of step (b) is then exposed to visible light such that the iodine is removed from the substrate and the amino-, carboxy-, or thiol-modified alkene reacts with the substrate to yield a surface of amino-, carboxy-, or thiol-modified alkane molecules covalently bonded to the substrate in the absence of any intervening oxygen molecules. The modified alkane molecules are then reacted with a crosslinker, whereby the crosslinker is attached to the modified alkane molecules. Lastly, molecules, such as DNA or RNA, are attached to the crosslinker, thereby yielding a surface of molecules immobilized on the substrate.

Because the reaction of the modified alkene with the surface of the bromine- or iodine-terminated substrate is photoinitiated, the reaction sites can be preselected to yield a desired pattern upon the surface of the substrate by selectively exposing the surface to the visible light.

The invention is also directed to modified substrate produced according to these methods.

In the preferred embodiment of the method, visible light mediates the reaction of an optionally-protected, ω-unsaturated aminoalkene, hydroxyalkene, carboxyalkene, or thioalkene (the most preferred being 10-aminodec-1-ene protected with t-BOC) with bromine- or iodine-terminated silicon. Removal of the protecting group yields an aminoalkane-modified, hydroxyalkane-modified, carboxyalkane, or thioalkane-modified silicon surface. These reactive terminal groups (amino, hydroxy, carboxy, thio) can then be coupled to modified oligonucleotides or other biomolecules either directly or using a heterobifunctional crosslinker, preferably SSMCC, thereby permitting the preparation of biomolecule arrays on an otherwise inert substrate.

A primary advantage of the present invention is that photopatterning of the substrate can be performed at room temperature and does not require exposure to heat, electrons, ions, or any other forms of energy that could destroy sensitive biological samples. The photopatterning can be performed at ambient pressures with no vacuum processing required. The photopatterning is performed using visible light of a moderate intensity (roughly 2–5 milliwatts per $cm^2$). This is in contrast to photoinitiated reactions using hydrogen-terminated silicon substrates, which require using higher-energy UV radiation to remove the terminal hydrogens.

Another primary advantage of the present invention is that it can be used to form highly ordered biomolecule arrays of defined surface density, including oligonucleotide arrays, on an inert, inorganic, unoxidized substrate.

Another distinct advantage of the present invention is that the surface density of biomolecules in the array can easily be controlled and manipulated. Control of surface density is provided in two fashions: In the first approach, binary mixtures of the protected ω-unsaturated aminoalkene and dodecene are utilized in an initial visible light-mediated coupling reaction. Here, a linear relationship was found between the mole fraction of ω-unsaturated aminoalkene in the binary mixture and the density of oligonucleotide hybridization sites. In the second approach, only a portion of the protecting groups are removed from the alkane-modified substrate surface by limiting the time allowed for the deprotection reaction, thereby limiting the number of available binding sites for oligonucleotide attachment.

Another advantage of the invention is the stability of the arrays. Oligonucleotide-modified surfaces formed utilizing the present invention are extremely stable and perform well in DNA hybridization assays. These surfaces provide an alternative to gold or glass for surface immobilization of oligonucleotides in nucleic acid arrays, as well as a route for the coupling of biomolecular recognition elements to semiconductor materials.

By permitting control of the density of the biomolecules within a modified surface or array, the invention described herein also permits control of the hydrophobicity and concomitant wetting characteristics of the functionalized silicon, germanium, or carbon surfaces, an important aspect in preparing reproducible and well-defined biomolecule arrays.

Figure 3C:
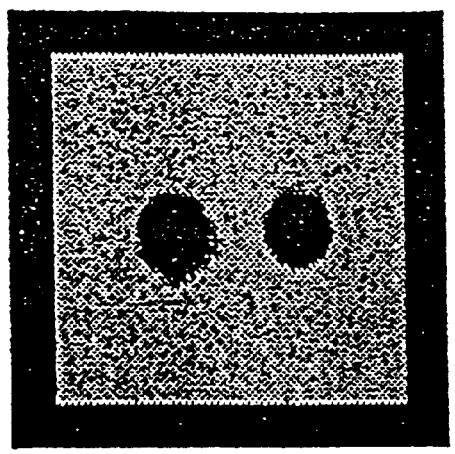
FIGS. 3a through 3c: Images of DNA modified silicon obtained using a Molecular Dynamics "FluorImager"-brand fluorescent imaging device. Two different oligo-nucleotides are attached to the surface in two spots approximately 2 mm in diameter. Hybridization with the fluorescent complement of the upper spot shows the expected image (FIG. 3a).
Figure 3B:
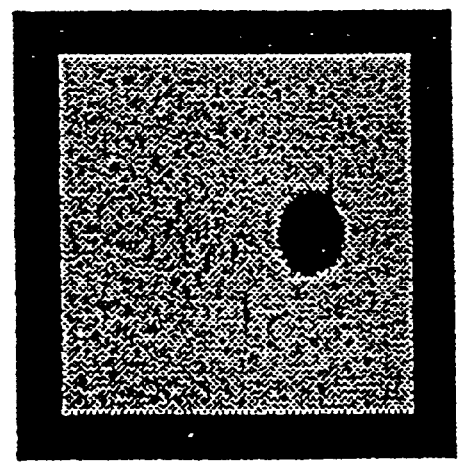

Denaturation and hybridization to the lower spot also shows the expected image (FIG. 3b). Denaturation and hybridization with both complements allows both spots to be visualized (FIG. 3c).

Figure 3A:
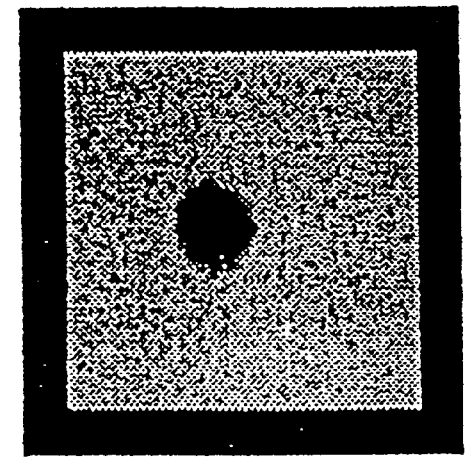
Figure 3D:
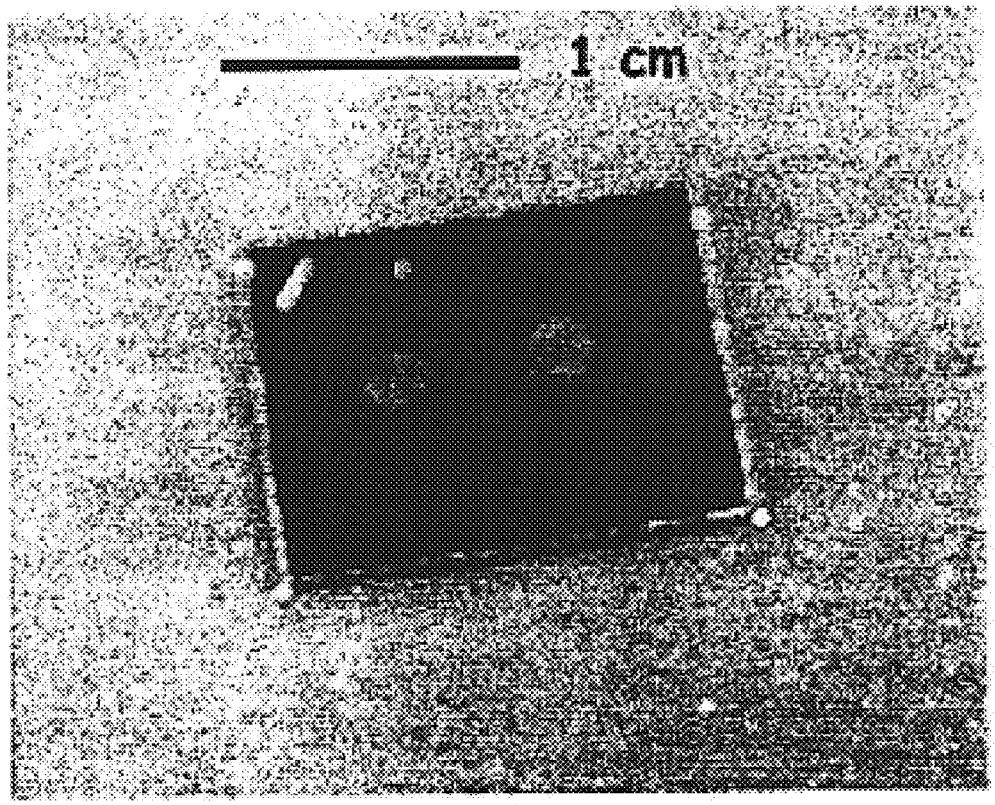

FIG. 3d: A photograph of the substrate of Example 2 after photoinitiation to attach ω-undecylenic acid methyl ester groups to an iodine-terminated silicon substrate.

Figure 4:
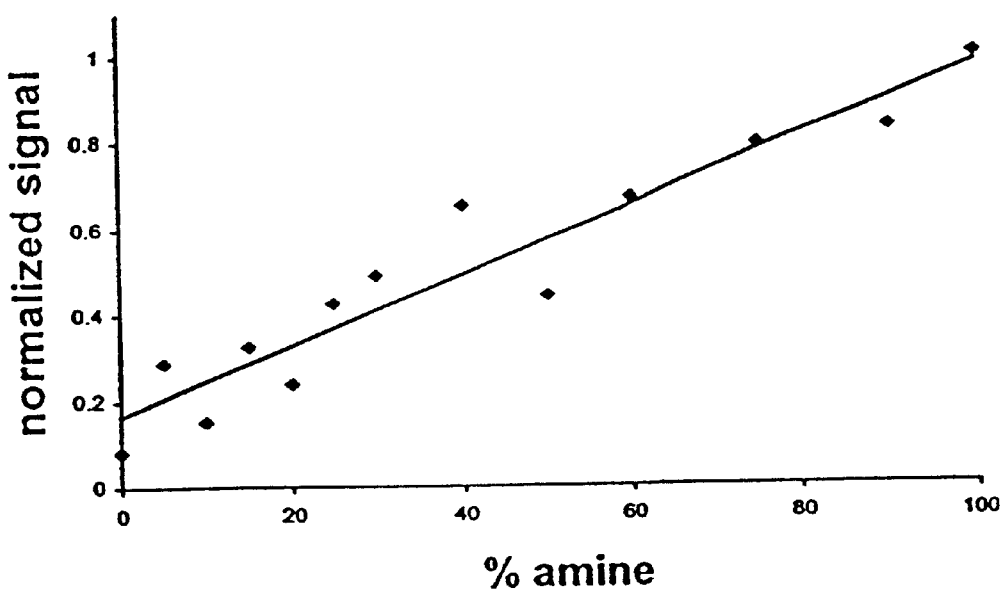

FIG. 4: Control of oligonucleotide density using binary mixtures of 10-aminodec-1-ene and dodecene. Mixtures containing different percentages of t-BOC-protected 10-aminodec-1-ene and dodecene were attached to the surfaces using visible light. Deprotection and addition of SSMCC and thiol DNA followed by hybridization with the fluorescent complement allowed for quantification of the signal. A linear relationship is observed between the fluorescence signal obtained and the percent of amine attached to the surface (y=0.0081x+0.1664; $R^2$=0.9045).

Figure 5:
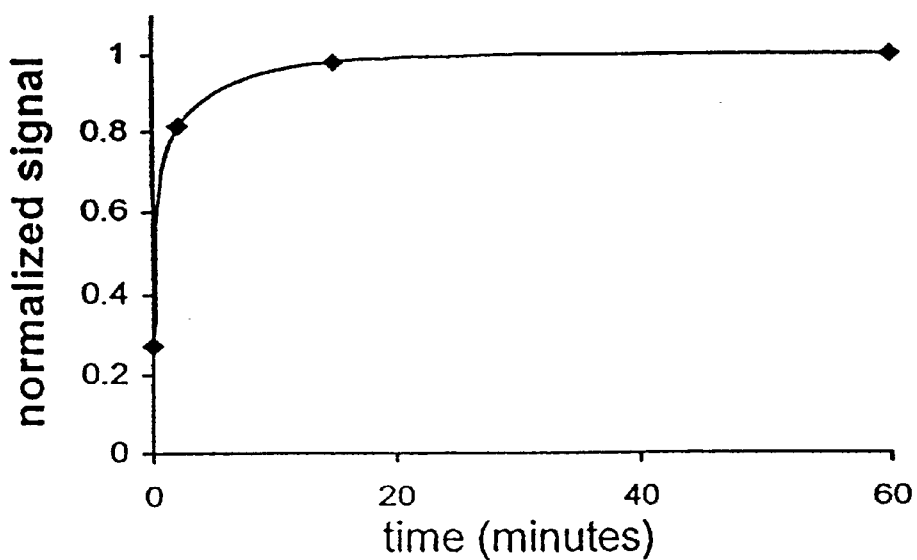

FIG. 5: Control of oligonucleotide density demonstrated by exposing surfaces prepared according to the present invention to deprotection conditions for differing lengths of time. Surfaces were deprotected, then modified with S SMCC and thiol DNA. Hybridizing with the fluorescent complement followed by imaging on a "FluorImager"—brand imaging device allowed for quantification of the signal. Exposure to TFA rapidly deprotects the t-BOC-modified 10-aminodec-1-ene molecules to yield surface amines.

Figure 6:
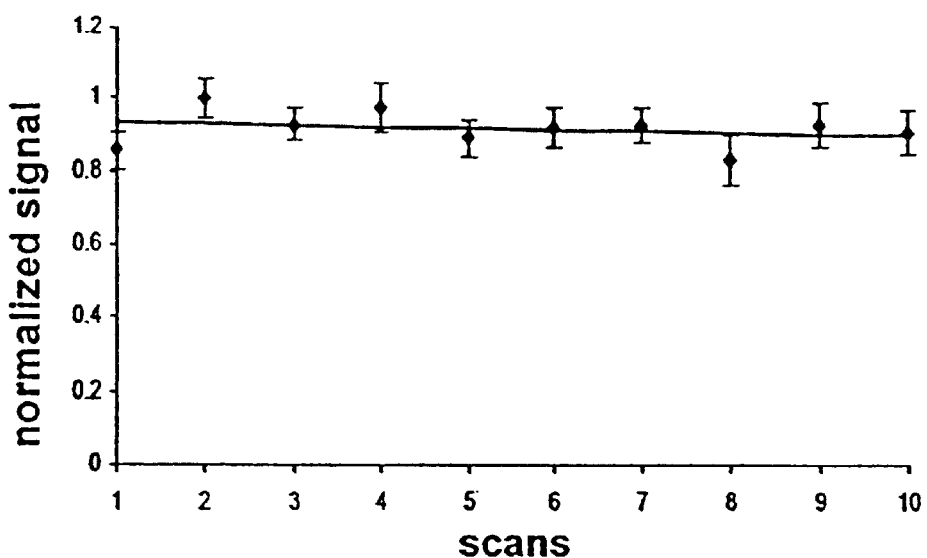

FIG. 6: Stability of silicon surfaces covalently modified with fluorescently tagged oligonucleotides. DNA-modified silicon surfaces were prepared according to the present invention using 3' thiol DNA with fluorescein on the 5' end. The surfaces were stored overnight in HB then scanned with a "FluorImager"—brand imaging device. Hourly scans recorded the surface fluorescence intensity. The observed fluorescence signal is stable throughout the experiment (y=−0.0041x+0.9395).

Figure 7:
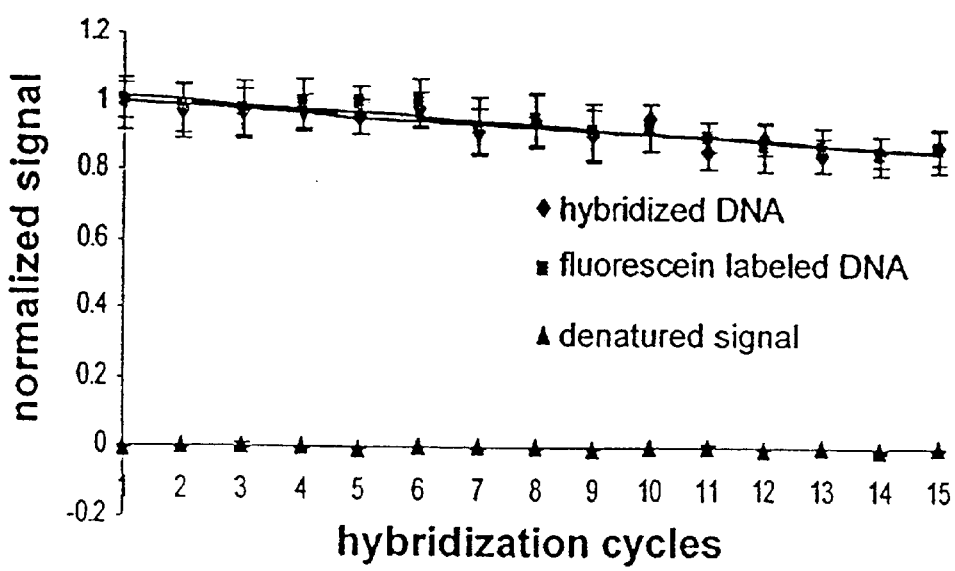

FIG. 7: Stability of surfaces prepared according to the invention during 15 hybridization and denaturation cycles. The measured fluorescence signal from both the hybridized DNA and the fluorescein tagged DNA decreases by approximately 1% with each hybridization cycle. The surfaces were also imaged after each denaturation step to demonstrate the complete removal of the fluorescent complement. No fluorescence signal from the complement was observed after denaturation. (hybridized DNA signal, y=−0.0097x+1.0059; fluorescein tagged DNA; y=−0.0113x+1.0241).

DETAILED DESCRIPTION OF THE INVENTION

Abbreviations:

The following abbreviations are used throughout the specification.

"Alkane(s)"=$C_2$-$C_{24}$ linear, branched, or cyclic alkane, and, where appropriate, corresponding alkyl groups.

"Alkene(s)" and "α-Alkene(s)"$C_3$–$C_{24}$ linear, branched, or cyclic alkene, mono- or poly-unsaturated, cis or trans or a combination thereof, and, where appropriate, corresponding alkenyl groups. An α-alkene is an alkene having one unsaturation, that unsaturation being present at a terminal carbon atom of the molecule.

"Biomolecule"=any molecule found in biological material, expressly including, but not limited to nucleic acids, proteins, peptides, antibodies, enzymes, cell-wall components such as phospholipids, etc., and modified and synthetic forms thereof, such as labeled biomolecules and recombinant biomolecules.

"Crosslinker"=Any chemical crosslinking reagent having two reactive moieties available for forming intermolecular bonds; the two reactive moieties may be the same or different.

"Fmoc"=9-fluorenylmethoxycarbonyl.

"HB"=Hybridization buffer; synonymous with 2'SSPE/ 0.2% SDS buffer (20 mM $NaH_2PO_4$, 300 mM NaCl, 2 mM EDTA, and 7 mM sodium dodecyl sulfate, pH 7.4.) or any buffer of equivalent functionality.

"Heterobifunctional crosslinker"=Any chemical crosslinking reagent having two reactive moieties available for forming intermolecular bonds wherein the two reactive moieties are different from each other.

"Modified alkene" and "ω-Modified alkene"=A "modified alkene" is an alkene modified by the addition of a chemically-reactive moiety such as an amino, hydroxy, carboxy, or thiol moiety. The reactive moiety may be located anywhere in the alkene with the exception of an alkenyl carbon. An "ω-modified alkene" is an alkene wherein the reactive moiety is situated on the terminal carbon of the alkene chain.

"Nucleic acid"=deoxyribonucleic acids (DNA), ribonucleic acids (RNA), and peptide nucleic acids from any source, and modified forms thereof, including, without limitation, labeled (radioactive, fluorescent, etc.) nucleic acids, and nucleic acids modified to include a binding moiety such as a thiol group or a biotin tag. "Nucleic acid" includes both DNA and RNA oligonucleotides comprised of the standard bases A, C, T, G, and U, and modified bases thereof, such as mono- or dimethylated bases, dideoxy bases, etc.

"Protecting group"=a chemical moiety capable of selective addition to and removal from a reactive site to allow manipulation of a chemical entity at sites other than the reactive site. A host of protecting groups are known in the art. An illustrative, non-limiting list of protecting groups includes methyl, formyl, ethyl, acetyl, t-butyl, anisyl, benzyl, trifluoroacetyl, N-hydroxysuccinimide, t-butoxycarbonyl, benzoyl, 4-methylbenzyl, thioanizyl, thiocresyl, benzyloxymethyl, 4-nitrophenyl, benzyloxycarbonyl, 2-nitrobenzoyl, 2-nitrophenylsulphenyl, 4-toluenesulphonyl, pentafluorophenyl, diphenylmethyl, 2-chlorobenzyloxycarbonyl, 2,4,5-trichlorophenyl, 2-bromobenzyloxycarbonyl, 9-fluorenylmethyloxycarbonyl, triphenylmethyl, and 2,2,5, 7,8-pentamethyl-chroman-6-sulphonyl.

"SSMCC"=sulfosuccinimidyl 4-N-maleimidomethyl)-cyclohexane-1-carboxylate.

"tBOC"=tert butoxycarbonyl, a protecting group

"TFA"=trifluoroacetic acid.

"UV"=ultraviolet

Preparing Substrate Surfaces

In the preferred embodiment of the invention, a silicon substrate is used. For purposes of brevity only, the disclosure that follows will assume that a silicon substrate is used. However, the method functions equally well and in the same fashion using germanium or carbon as the substrate. A silicon substrate is preferred because of its ubiquity in the semi-conductor industry.

In the preferred embodiment, silicon wafers are treated similar to the method described by Sieval with some modification[39,41] to yield a substrate surface that is terminated with hydrogen molecules. The wafers are sonicated in acetone for 5 minutes and then methanol for 5 minutes. The wafers are then soaked in a hydrogen peroxide-ammonia-water bath (1:1:4) for 5 minutes at 75° C. The wafers are then briefly dipped in 2% hydrofluoric acid to hydrogen-terminate the silicon atoms.

Replacing Hydrogen-terminated Surface with Bromine- or Iodine-terminated Surface After the substrate is treated to yield an initial hydrogen-terminated surface, the hydrogen atoms are removed from the substrate surface and either bromine or iodine (or a combination thereof) are chemically bonded to the substrate surface. This can be done using any reagent or combination of reagents that will reliably remove hydrogen atoms from the substrate surface and replace in their stead bromine or iodine atoms.

In the preferred embodiment of the invention, the hydrogen-terminated substrate wafers are soaked in an $I_2$/benzene solution to replace the hydrogens with iodine (or a $Br_2$/benzene solution if bromine is desired). This treatment yields a surface in which the substrate surface is uniformly characterized by substrate molecules (be they silicon, carbon, or germanium) bonded to a terminal iodine or bromine molecule, in the absence of any intervening oxygen bond between the iodine or bromine and the substrate surface.

Reacting Modified Alkenes with Substrate

Once the substrate surface has been prepared so that the substrate molecules terminate in either a bromine or an iodine, the prepared substrate is subjected to a reaction, preferably photoinitiated, wherein the bromine is removed and the substrate molecules reacted with an alkene group of a modified alkene, thereby yielding a surface characterized by covalently attached alkyl groups bearing a reactive moiety (or alkenyl groups if the modified alkene contains more than one unsaturation). As described in fill in the sections that follow, it is preferred that the modified alkene contain a single α-position double bond and a single ω-position chemically-reactive moiety.

In the preferred embodiment, a thin film of modified alkene is placed on the iodine-terminated substrate wafer, and the wafer is then exposed to visible light (preferably at 514 nm). The visible light removes the iodine. The visible light also initiates the formation of a Si—C bond via a reaction between the double bond of the modified alkene and the silicon surface.

In the most preferred embodiment of the invention, an ω-modified and protected α-alkene is reacted with a carbon, silicon, or germanium substrate to yield an array of protected, ω-modified alkane molecules covalently bonded to the substrate. It is most preferred that this reaction be photoinitiated by contacting the alkene with the substrate and then exposing the two to a suitable wavelength of visible light, for example 514 nm. For this purpose, any reaction chamber designed for conducting photoinitiated chemical reactions may be utilized. Such reaction chambers are well known to the art and can be fabricated or purchased from many commercial suppliers.

Because the reaction of the modified alkene with the iodine- or bromine-terminated substrate surface is photoinitiated, by controlling where the light falls upon the substrate/alkene, the points of attachment can be photopatterned. Photopatterning is preferred to create a patterned surface, although the method of creating the patterned surface is not critical so long as the method reliably yields the desired pattern. For example, microcontact printing methods can also be used to yield a patterned surface. Using photopatterning, the substrate surface, coated with one or more modified alkenes, is exposed to the visible light through a light-opaque mask that prevents reaction from occurring at the shielded locations.

After photopatterning, the surface of the substrate is gently rinsed to remove any remaining reactants.

Photopatterning is, of course, optional. The entire substrate may be exposed to the visible light to yield a substrate uniformly coated with covalently attached modified moieties. Alternatively, the substrate surface may be photopatterned to yield a desired array of spots wherein each spot includes the same or different attached moieties. Note that in the preferred embodiment, wherein an α-alkene is used, the photoreactive moiety is the double bond of the alkene, which is consumed in the reaction to yield an C—Si covalent attachment in the case of a silicon substrate.

ω-Modified Alkenes

An alkene having a reactive moiety, and preferably a terminal (that is, ω-position) reactive moiety, is utilized in the present reaction to provide a means to attach still further molecules to the substrate surface after addition of the alkene. The reactive moiety may be situated anywhere within the modified alkene, except on an alkenyl carbon. If the reactive moiety is attached at a terminus of the alkene, the alkene is defined herein as an ω-modified alkene. It is much preferred that the alkene be between 3 and 24 carbons long and have a single unsaturation at or near a terminal carbon of the alkene. The alkene may have more than one unsaturation, and may be linear, branched, or cyclic.

The modification to the alkene may be the addition of any moiety which enables further covalent linkages to be made to the alkene after its attachment to the substrate surface. As noted in the definitions, the modification need not necessarily be located at the physical terminus of the alkene, although that is much preferred because it makes the modification easily available for further reaction. Such modifications include, without limitation, the addition of an amine-containing group, a carboxyl-containing group, or a thiol-containing group to or near the ω carbon of the alkene chain.

Because the modification may itself be reactive, it may need to be protected during the first reaction of the alkene with the substrate. Not all reactive modifications need to be protected, however. For example, many carboxy-containing groups will not be adversely affected by the preferred photochemistry used to attach the alkene to the substrate, and therefore do not need to be protected. In general, protecting the reactive modification on the alkene can be done with any type of protecting group suitable for the reactive modification chosen.[50] An illustrative list of suitable protecting groups is provided in the definitions. In short, the choice of a protecting group used is dependent in large measure upon the nature of the modification made to the alkene. If the modification is the addition of a carboxyl group, there may be no need for a protecting group at all, or a carboxy protecting group would be used. Likewise, if the modification is the addition of an amino or a thiol group, an amino or thiol protecting group, respectively, would be used. Numerous such protecting groups, for any number of reactive moieties, such as amine, carboxy, and thiol functionalities, are known to the art. Many are quite hydrophobic. For amino-terminated alkenes, t-BOC is most preferred. t-BOC is a common acid labile protecting group.[50] Other acid-labile protecting groups are known to the art.

Figure 1:
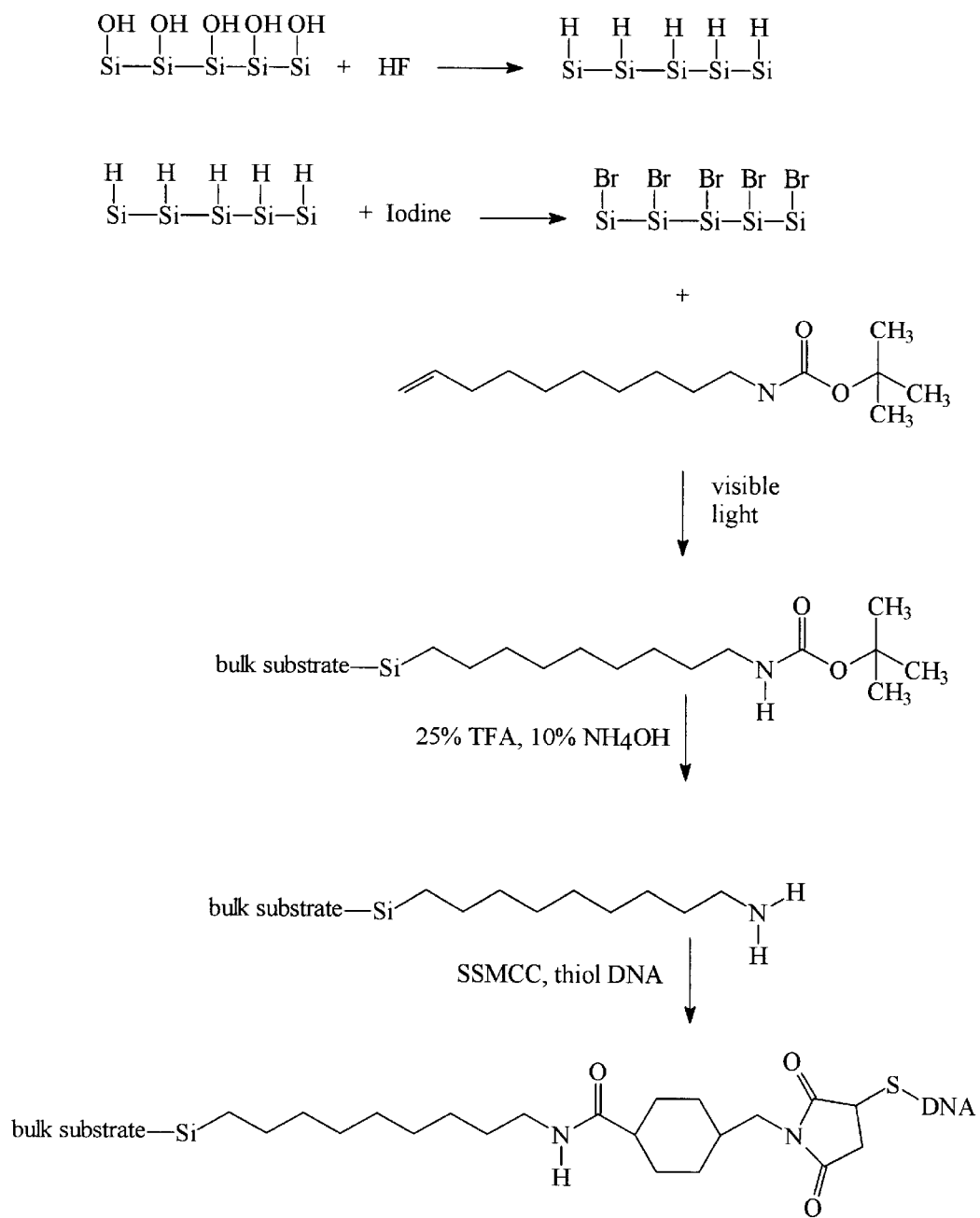
FIG. 1: Reaction scheme for immobilization of DNA on an amine-modified silicon (001) wafer. A layer of t-BOC-protected 10-aminodec-1-ene was bound to the iodine-terminated silicon surface by applying a thin layer of the protected amine to the wafer and exposing it to visible light from an argon laser. Deprotection was accomplished by treating the surface with 25% TFA in $CH_2Cl_2$ for 1 hour followed by a 5 minute rinse in 10% $NH_4OH$. The crosslinker SSMCC was added to the surface, whereby it bound to the free amines through an N-hydroxysuccinimidyl ester. Thiol DNA was then bound to the maleimide groups of the SSMCC.

An illustrative example of a photoinitiated reaction of an amino-modified, t-BOC-protected alkene with a silicon substrate is shown in FIG. 1. Here, the protected, amino-modified alkene is contacted with an iodine-terminated silicon substrate and exposed to visible light at 514 nm. This causes the terminal double bonds of the alkene to form covalent Si—C bonds with the unoxidized silicon substrate.

Once the protected alkene has been reacted with the substrate, the protecting groups (if any) are removed. Removal can be accomplished chemically and depends in large measure upon the type of protecting group chosen. Such methods of deprotecting are well known to those in the art. For the t-BOC protecting group, treatment with TFA removes the protecting group to yield a reactive primary amine group.

The preferred modified alkene for use in the invention is an ω-amino-$C_3$–$C_{24}$-alkene, having a single α unsaturation, a straight-chain or cyclic alkene being preferred over a branched alkene; the most preferred ω-modified alkene is 10-aminodec-1-ene. As noted above, the preferred protecting group for amine-modified alkenes is t-BOC.

Attaching Molecules to the Surface-bound Moiety

Once the substrate surface has been modified to contain a monolayer of reactive moieties in the form of modified alkanes bound to the surface of the substrate (or alkenes if the modified alkene contains more than one unsaturation), molecules can then be bound to the modification by any means known to the art. The molecules can be attached directly to the modification or via a crosslinker interposed between the modification of the surface-bound alkane and the incoming molecule to be attached.

Where the modification to the alkene is either a carboxy or amino moiety, well characterized chemistries widely used in the solid-phase synthesis of polypeptides can be utilized to link proteins or other carboxy- or amino-group bearing biomolecules directly to the ω-modification of the surface-bound alkane.

Briefly, in solid phase reactions, reactive moieties in the incoming molecule to be bound to the substrate are protected, with the exception of one or more moieties which will serve as the attachment point. In certain instances, the moiety residing at the desired attachment point must be activated to induce a reaction between the incoming molecule and the modification of the surface-bound alkane. For example, by activating a molecule bearing a carboxy group, such as by reacting with dicyclohexylcarbodiimide, the incoming molecule will bind to an exposed amino group at the activated carboxy moiety. Whereas in peptide synthesis, the process is repeated over and over to add additional amino acids, here, only a single coupling reaction is employed to link the incoming molecule onto the alkane-covered surface.

It is more preferred, however, to utilize a crosslinker, and more preferred still to use a heterobifunctional linker to provide a link between the molecule and the alkane-covered substrate. The most preferred linker is SSMCC. SSMCC contains an amine-reactive N-hydroxysuccinimide ester as well as a thiol-reactive maleimide moiety. This bifunctionality makes SSMCC the preferred linker due to its ability to bind thiol-modified nucleic acids to the alkane-modified substrate. Such a link is shown in the last reaction step depicted in FIG. 1. Thiol modifications can be made to nucleic acids using well-known reagents such as S-trityl-6-mercaptohexyl-(2-cyanoethyl)-(N,N-diisopropyl)-phosphoramidite and 1-O-dimethyloxytrityl-hexyl-disulfide, 1'-{(2-cyanoethyl)-(N,N-diisopropyl)}-phosphoramidite.

Other suitable crosslinking moieties are known for other types of modifications. For example, diamines, dialdehydes, dicarboxylic acids, amino acids, and the like can be used as crosslinking agents.

To attach nucleic acids to the modified, substrate-bound moieties, the deprotected surface is contacted with SSMCC for a time sufficient to allow the N-hydroxysuccinimide ester portion of the SSMCC to react with the reactive moiety (preferably an amino group) of the bound alkane. The substrate is gently rinsed to remove unreacted SSMCC. The SSMCC-modified substrate is then reacted with thiol-modified nucleic acid to form nucleic acid surfaces or arrays on a silicon substrate. The nucleic acid-modified surfaces are then rinsed with distilled water and stored at 37° C. in HB to remove non-specifically bound strands of nucleic acid.

To ensure the quality of the initial reaction with the modified alkene, the reaction with the crosslinker (if any), or the reaction with an incoming molecule such as a nucleic acid, each reaction step may be monitored using PM-FTIRRAS, XPS, contact angle measurements, etc.

X-ray Photoelectron (XPS) Measurements

Figure 2A:
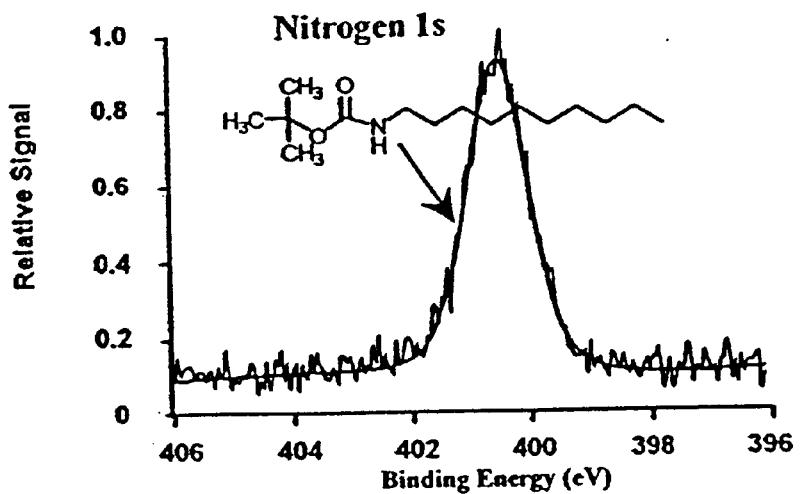
FIGS. 2a through 2f: X-ray photoelectron spectra of the t-BOC-protected 10-aminodec-1-ene immobilized on a silicon substrate (FIG. 2a). The nitrogen spectrum shows a single peak at 400.5 eV. After treatment in 25% TFA for 1 hour (FIG. 2b), two peaks are recorded. The $NH_3^+$ and the primary amine have been assigned the peaks at 401.9 and 400.2 eV, respectively. A surface that has been treated with 25% TFA followed by a five-minute rinse in 10% $NH_4OH$ shows only one peak at 400.3 eV (FIG. 2c). This indicates the $NH_3^+$ nitrogens have been completely deprotonated. The carbon spectrum of the t-BOC-protected amine shows a strong peak at 285 eV (FIG. 2d) assigned to the bulk carbons, as well as a peak at 289.7 eV assigned to the carbonyl carbon of the t-BOC group. The carbonyl peak is reduced by approximately 70% after deprotection with TFA (FIG. 2e) and $NH_4OH$ (FIG. 2f). The shoulder at 287.2 eV has been attributed to the t-butyl carbon.
Figure 2B:
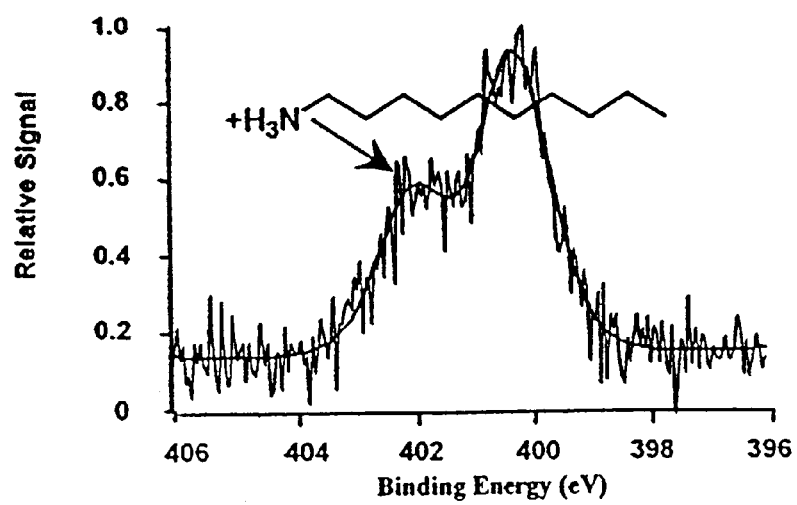
Figure 2C:
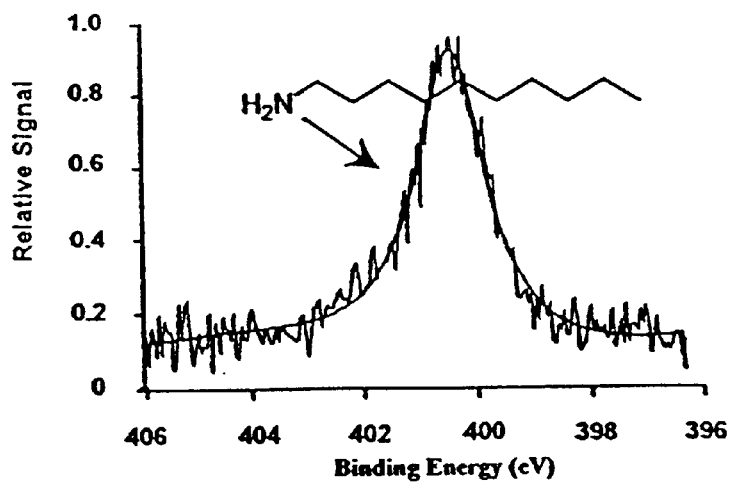
Figure 2D:
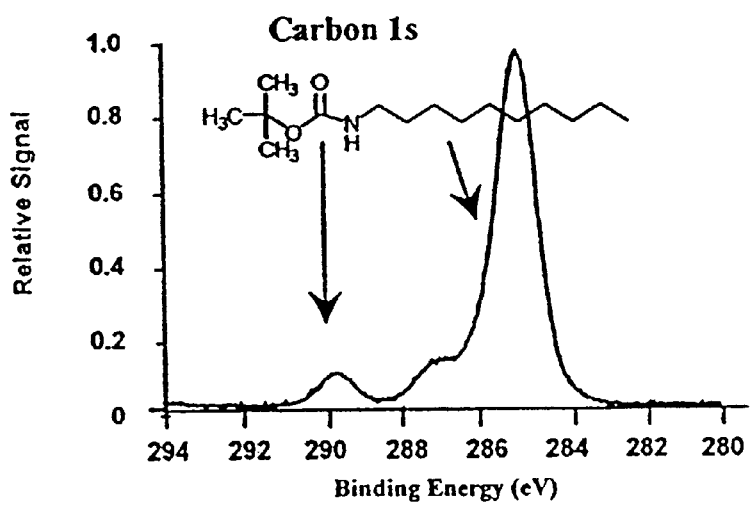
Figure 2E:
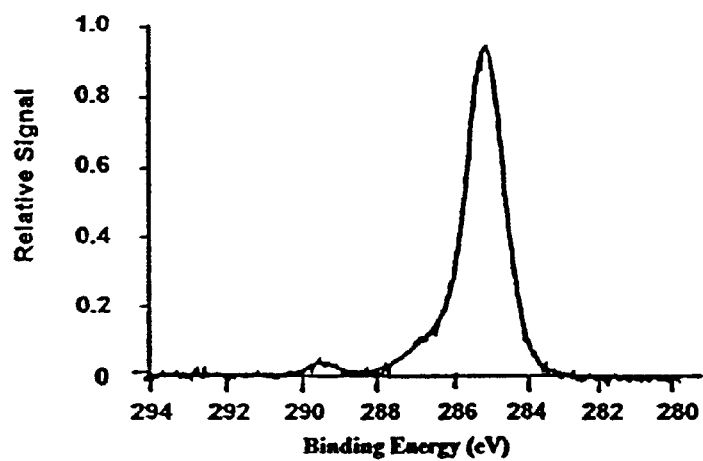
Figure 2F:
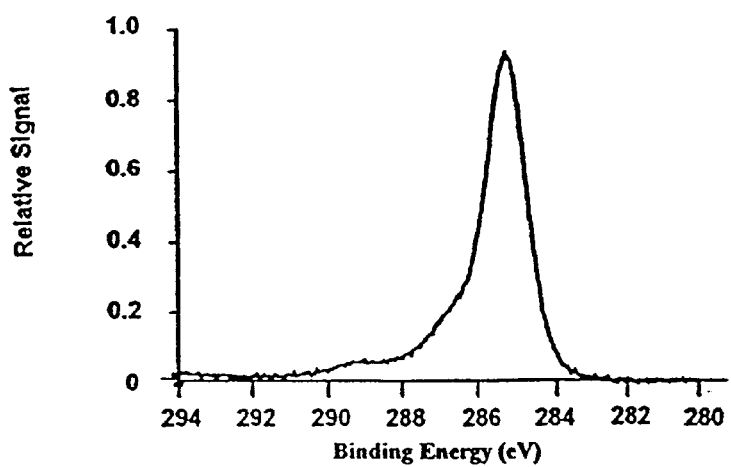

X-ray photoelectron spectroscopy (XPS) was performed on protected and deprotected surfaces to measure the extent of deprotection. X-ray photoelectron spectra of t-BOC-protected 10-aminodec-1-ene bound to a silicon substrate are shown in FIG. 2a. The nitrogen spectrum shows a single peak at 400.5 eV. After treatment in 25% TFA for 1 hour (FIG. 2b), two peaks are recorded. The $NH_3^+$ and the primary amine have been assigned the peaks at 401.9 and 400.2 eV, respectively. A surface that has been treated with 25% TFA followed by a five-minute rinse in 10% $NH_4OH$ shows only one peak at 400.3 eV (FIG. 2c). This indicates the $NH_3^+$ nitrogens have been completely deprotonated. The carbon spectrum of the t-BOC-protected amine shows a strong peak at 285 eV (FIG. 2d) assigned to the bulk carbons, as well as a peak at 289.7 eV assigned to the carbonyl carbon of the t-BOC group. The carbonyl peak is reduced by approximately 70% after deprotection with TFA (FIG. 2e) and $NH_4OH$ (FIG. 2f). The shoulder at 287.2 eV has been attributed to the t-butyl carbon.

Regrettably, the nitrogen is peak of the t-BOC protected surface is nearly identical to that of the nitrogen peak on the primary amine surface (see FIGS. 2a and 2c). XPS of the amine salt, taken before rinsing in ammonium hydroxide, clearly shows two nitrogen peaks (FIG. 2b). A peak at 401.9 eV binding energy is thought to represent the $NH_3^+$ while a peak at 400.2 eV is assigned to the primary amine nitrogens. It is interesting to note that the nitrogens do not become completely protonated after exposure to the TFA solution. After rinsing in ammonium hydroxide a single peak at 400.3 eV appears (FIG. 2c). The carbon Is spectrum of the protected surface shows a peak at 289.7 eV assigned to the carbonyl carbon of the t-BOC group (FIG. 2d). This peak is dramatically reduced using the deprotection conditions, indicating that most of the t-BOC groups have been removed (FIGS. 2e and 2f). Peak fitting using IGOR indicates approximately 70% of the t-BOC groups have been removed. It should be noted, however, that areas of these smaller peaks could only be estimated due to the large amount of error associated with the fitting parameters. Optimizing the deprotection conditions through increasing the temperature, TFA concentration, and time of reaction yielded similar results.

Contact Angle Measurements

Contact angles were measured for the surface at various stages of deprotection.

TABLE 1

| SURFACE | CONTACT ANGLE θ |
| --- | --- |
| t-BOC-protected amine | 78.1° |
| TFA-treated | 55.4° |
| TFA & $NH_4OH$-treated | 76.8° |

The t-BOC protected amine was the most hydrophobic. Upon exposure to 25% trifluoroacetic acid for one hour the contact angles became smaller, consistent with the behavior expected from the hydrophilic surface associated with the protonated amine salt. Rinsing the surface further in 10% ammonium hydroxide removed the salt and produced the primary amine surface, which was evidenced by an increase in the contact angle measurements.

Specific Hybridization

As described in the Examples, amine-modified surfaces were employed as substrates for the preparation of small DNA arrays, which were characterized with respect to their performance in DNA hybridization experiments. See FIGS. 3a–3c. Two different types of oligonucleotides were immobilized on an unoxidized, iodine-terminated silicon (001) surface (approximately 1 cm×1 cm) in approximately 2 mm diameter spots using the method described herein. A solution of fluorescently labeled oligonucleotide complementary to one of the immobilized oligonucleotides was placed on the surface and allowed to hybridize. FIG. 3a shows the image obtained after hybridization and washing. A single spot appears, indicating successful hybridization to the selected oligonucleotide. Imaging following denaturation and hybridization with the alternate fluorescent oligonucleotide shows the second individual spot (FIG. 3b). A final denaturation and subsequent hybridization with both fluorescently tagged complements, followed by imaging revealed both spots, as expected (FIG. 3c).

Control of Surface Density of Attachment Sites

Control of the density of surface attachment sites is a major advantage of the present invention because it allows for control of the density of bound biomolecules such as oligonucleotides. For example, while some applications may require densely packed DNA strands, others may require greater spacing between bound oligonucleotides. Control of the surface density of attachment points on the substrate surface was demonstrated in two different ways; 1) by using mixtures of a protected amino-modified alkene and dodecene during the attachment step; and 2) by controlling the exposure time of the t-BOC protected amine surface to TFA, thereby limiting the extent of deprotection of the amine-modified surface.

Control of the number of surface reactive amine sites was demonstrated using mixtures of t-BOC-protected 10-aminodec-1-ene and dodecene. Dodecene, because it lacks an ω reactive moiety, is unreactive once attached to the silicon surface. Mixtures containing increasing fractions of t-BOC-protected 10-aminodec-1-ene were applied to iodine-modified silicon substrates and allowed to react under 514 nm visible light. The surfaces were then treated as described herein with TFA (to deprotect), SSMCC (a crosslinker), and DNA. Hybridization with the fluorescent complement and subsequent quantification of the fluorescence image was done on the surfaces. The plot shown in FIG. 4 shows a linear relationship between the measured fluorescence signal and the fraction of 10-aminodec-1-ene. This finding clearly demonstrates that the density of surface amine groups can be readily controlled, which in turn allows for control of the ultimate surface density of bound oligonucleotides or other biomolecules available for hybridization or further study.

An alternate method of controlling the density of surface attachment sites involves controlling the exposure time of the initially protected, ω-modified surface to deprotection conditions. To demonstrate this approach, four iodine-terminated silicon surfaces were reacted according to the invention with t-BOC protected 10-aminodec-1-ene. The surfaces were then exposed to 25% TEFA for 0, 2, 15, and 60 minutes. The surfaces were then modified with SSMCC and 5'-thiol-DNA and hybridized with fluorescent complement. FIG. 5 is a plot of the fluorescence signals of each of these surfaces. The amount of fluorescence measured depends on the time of exposure to the deprotecting agent. Deprotection occurs rapidly up to about 15 minutes of exposure time, at which point most of the t-BOC groups have been removed. Continuing the deprotection for 60 minutes yields slightly more free amines available for reaction.

Stability

An important parameter of the DNA-modified silicon surfaces is their stability to the conditions employed for biochemical procedures such as nucleic acid hybridization and enzymatic manipulation. Two experiments were performed to evaluate the stability of the DNA-modified surfaces. The stability of the bonds linking a DNA oligonucleotide covalently to the surface was evaluated by means of a fluorescent tag covalently attached to the oligonucleotide (SEQ. ID. NO:3); the surface was incubated in HB overnight and the surface fluorescence was measured repeatedly (see FIG. 6). No significant decrease in the fluorescence intensity was observed, indicating that the DNA-surface linkage was stable under the conditions examined.

In a second experiment, a surface modified with fluorescein labeled DNA (SEQ. ID. NO:3) in one area and non-labeled DNA (SEQ. ID. NO:1) in another was hybridized repeatedly with the fluorescent complement of SEQ. ID. NO:1. The measured fluorescence intensity of SEQ. ID. NO:3 was typically two thirds that of SEQ. ID. NO:1 hybridized to its fluorescent complement. The normalized data show both signals decay at essentially identical rates (FIG. 7). The fluorescence intensity after 15 cycles decays to approximately 85% of the initial value. This corresponds to a loss of approximately 1% per cycle. This stability is superior to previously published results using a non-covalent surface attachment chemistry.[44] These two findings demonstrate that unoxidized silicon surfaces modified according to the invention exhibit excellent stability under the storage and hybridization conditions employed.

EXAMPLES

The following Examples are included solely to provide a more complete understanding of the invention disclosed and claimed herein. The Examples do not limit the scope or generality of the attached claims in any fashion.

Example 1

Attachment of Perfluorooctadecene to Iodine-terminated Silicon

In this example, a silicon substrate was treated with HF and a benzylic solution of iodine, as described above for the preferred embodiment, to yield a silicon substrate whose surface was terminated with Si—Br bonds.

Perfluorooctadec-1-ene was applied as a drop of liquid to the surface of the substrate. The coated surface was then exposed to visible light at 514 nm from an argon laser, defocused, at an intensity of approximately 20 milliwatts per $cm^2$. This is roughly the amount of energy generated by a laser pointer. The reaction was followed via x-ray photoelectron spectroscopy by monitoring the disappearance of the Si—I peak from the starting spectrum and the appearance of a fluorine peak in the surface compositional analysis. As expected, over the course of the exposure (3 hours), the Si—I peak slowly disappeared and there was a concomitant appearance of a fluorine peak as the perfluorooctadecene attached to the surface of the silicon substrate. Control experiments run in the dark showed no significant attachment of the perfluoro compound to the substrate surface.

Example 2
Photopatterning Using Undecylenic Acid Methyl Ester

In this example, an iodine-terminated silicon substrate was prepared in the same fashion as in Example 1. A thin layer of ω-undecylenic acid methyl ester. A small region of the coated substrate was then exposed to 514 nm laser light in the same fashion as in Example 1 (2 hours), while the remainder of the sample was masked off and kept in the dark. After the photo-treatment, the sample was gently washed. At this point in the experiment, the illuminated and unilluminated portions of the substrate could be readily distinguished by sight (see FIG. 3d). The sample was then immersed in dodecene (a hydrophobic molecule) and the entire sample was briefly immersed in potassium t-butoxide (a base) to hydrolyze the ester to yield the acid form. The resulting sample displayed wetting in the irradiated portions of the substrate and hydrophobic behavior in the non-irradiated portions. This demonstrates that the undecylenic acid methyl ester in fact bonded to the surface of the substrate and further that the methyl ester portion of the bonded molecules could be removed without detaching the molecules from the surface of the substrate.

Example 3
Synthesis of Oligonucleotides

All oligonucleotides were synthesized by the University of Wisconsin Biotechnology Center, Madison, Wis. Two types of oligonucleotides were employed for the Examples which follow: oligonucleotides to be attached to the surface, and oligonucleotides employed for hybridization to the surface. Oligonucleotides to be attached to the surface were thiol-modified at either the 5' end using the reagent 5'-Thiol-Modifier C6 (HSC6, Glen Research, 22825 Davis Dr., Sterling, Va. 28164, www.glenres.com), or at the 3' end using the reagent 3'-Thiol-Modifier C3 S-S CPG (C3SH, Glen Research); each of these oligonucleotides were 31 nt in length, comprised of a 15-mer dT spacer sequence at the 5' end, and a specific 16-mer sequence at the 3' end. The three 31-mer sequences employed were

```
                                        (SEQ. ID. NO:1)
5'-HSC6-T15AA CGA TCG AGC TGC AA3',
                                        (SEQ. ID. NO:2)
5'-HSC6-T15AA CGA TGC AGG AGC AA3', and
                                        (SEQ. ID. NO:3)
5'-FAM-T15AA CGA TCG AGC TGC AA-C3SH3'.
```

In SEQ. ID. NO:3, "FAM" refers to a fluorescein dye incorporated into the oligonucleotide during synthesis using the reagent 6-FAM phosphoramidite (Perkin-Elmer Biosystems, Foster, Calif.). Oligonucleotides employed for hybridization to their surface-bound complements were 16 nt in length and complementary to the 3' 16 nt of either SEQ. ID. NO:1 or SEQ. ID. NO:2. These oligonucleotides were also modified with FAM on the 5' end. The thiol-modified oligonucleotides were deprotected according to guidelines from Glen Research,[45,46] and purified by reversed-phase HPLC with a binary gradient elution. The 16 nt complements were purified in the same manner. Other reagents were obtained from Aldrich Chemical Company, Milwaukee, Wis. unless otherwise noted and are as follows: 1-dodecene, 10-undecenoyl chloride, sodium azide, trifluoroacetic acid (TFA), di-tert-butyl dicarbonate (Acros Organics, Janssens Pharmaceuticalaan 3A, 2440 Geel, Belgium, www.acros.com), sulfo-succinimidyl 4-(N-maleimidomethyl) cyclohexane-1-carboxylate (SSMCC) (Pierce Chemical, Rockford, Ill.), silicon (001) wafers (Virginia Semiconductor, Fredricksburg, Va., www.VirginiaSemi.com). Ultra pure water used for rinsing the wafers was obtained from a Millipore system (Marlborough, Mass.).

Example 4
Synthesis of 10-Aminodec-1-ene

The 10-aminodec-1-ene used to modify the silicon surfaces was prepared using a variant of the Curtius reaction.[47] A solution of 40.5 g of 10-undecenoyl chloride and tetrabutylammonium bromide (200 mg) was prepared in 300 mL of dichloromethane and cooled in an ice bath. Sodium azide (15.6 g) was dissolved in 50 mL of water and added to the mixture. This mixture was stirred continuously for 2 hours in an ice bath. The organic layer was removed, washed twice with 50 mL of water, dried over anhydrous magnesium sulfate for 36 hours and filtered. Trifluoroacetic acid (20.3 mL) was slowly added with stirring and the mixture was refluxed for 6 hours. The resultant mixture containing the trifluoroacetamide was cooled and washed twice with 50 mL of saturated aqueous sodium bicarbonate, then dried over magnesium sulfate and filtered. The solvent was removed by rotary evaporation to yield an oil which was vacuum distilled to produce the pure trifluoroacetamide. Nuclear magnetic resonance confirmed the identity of the trifluoroacetamide. Cleavage of a 10 mL portion of the trifluoroacetamide was accomplished by refluxing for 3 hours in 500 mL of a 7% potassium carbonate water:methanol (2:5) solution.[48] The free amine was extracted twice with 100 mL of ether, which was again dried over magnesium sulfate and filtered. Removal of the solvent by rotary evaporation and vacuum distillation yielded the desired product. Nuclear confirmed its identity as the pure amine.

Example 5
Synthesis of t-BOC-protected Amine t-BOC protected 10-aminodec-1-ene was prepared by standard methods.[49] A portion of the purified amine (5.11 g) was dissolved in 60 mL of chloroform that was added to a solution of 3 g $NaHCO_3$ in 50 mL of water. Sodium chloride (6.45 g) was added along with 7.18 g of di-tert-butyl dicarbonate dissolved in a few milliliters of chloroform. This mixture was refluxed for 90 min and extracted twice with 50 mL of ether. The collected organic extracts were dried over magnesium sulfate, filtered and the ether removed by rotary evaporation. The t-BOC-protected product was purified by vacuum distillation, and its identity was confirmed by NMR. Treating a 10 mL aliquot of this product with 1 mL of 25% TFA in methylene chloride for 1 hour at room temperature recovered the free amine as demonstrated by thin layer chromatography.

Example 6
Preparation of DNA Modified Surface

Silicon wafers were prepared for modification as previously described.[19,41,44] The wafers were briefly exposed to a 2% solution of hydrofluoric acid in water to hydrogen terminate the surface atoms. The wafers were then immediately placed in the reaction chamber, covered with 10–30 mL of the t-BOC-protected 10-aminodec-1-ene, and exposed to ultraviolet light from the UV lamp for 2 hours. The volume of the t-BOC-protected 10-aminodec-1-ene used was enough to just cover the surface and varied with the size of the wafers. The thickness of the layer covering the wafer was not directly measured or controlled but was typically less than 1 mm. The modified surfaces were then subjected to 25% TFA in methylene chloride followed by a 3 minute rinse in 10% $NH_4OH$ to remove the t-BOC protecting group and form the primary amine-terminated surface. These surfaces were placed in a 50 mL droplet containing the heterobifunctional crosslinker SSMCC (1.5 mM in 100 mM triethanolamine buffer, pH 7) for 20 minutes. SSMCC contains an amine reactive N-hydroxysuccinimide ester as well as a thiol reactive maleimide moiety. The maleimide activated surfaces were reacted overnight with 0.4–0.8 mL droplets of approximately 1 mM thiol-modified DNA to form the DNA arrays. The DNA modified surfaces were then rinsed with distilled water and stored at 37° C. for 1 hour in 2'SSPE/0.2% SDS buffer (20 mM $NaH_2PO_4$, 300 mM NaCl, 2 mM EDTA, and 7 mM sodium dodecyl sulfate, pH 7.4, designated herein as "HB") to remove non-specifically bound strands.

Example 7
Hybridization and Denaturation

Procedures utilized to hybridize fluorescent complements to the surface-bound oligonucleotides have been described in detail elsewhere.[28,44] Briefly, the DNA-modified silicon surfaces were removed from HB and rinsed with distilled water then exposed to 5–10 ml of 2 mM 5'-fluorescein labeled complement in HB, and allowed to hybridize for 20 minutes at room temperature in a humid chamber. The hybridized surfaces were then rinsed twice for five minutes in HB to remove any unhybridized complement. The hybridized DNA modified surfaces were then placed facedown in a droplet of HB on a Molecular Dynamics FluorImager 575 tray and scanned. This allowed visualization and quantitation of the fluorescent areas on the silicon surfaces. Denaturation was accomplished by placing the surfaces in an 8.3 M urea solution at room temperature for 5 minutes followed by a water rinse. The surfaces were then rescanned with the FluorImager to ensure that complete denaturation had been accomplished. Subsequent hybridizations, if required, could be repeated using the same procedure. Alternatively, for the number density experiment, denaturation was accomplished by placing the hybridized surfaces in a small volume of water at 90° C. for 15 minutes. This denatured the duplex and allowed the fluorescent complements to be collected for quantitation.(28, 44)

Example 8
Control of DNA-modified Amine Surface

A series of Examples were conducted to characterize the behavior of the bound oligonucleotides and to control the density of the free amines. Hybridization specificity was tested by immobilizing two different kinds of oligonucleotides (SEQ. ID. NO:1 and SEQ. ID. NO:2) onto the surface, followed by selective hybridization to either of the fluorescent complements. The density of free amines on the surface can be controlled by reaction of the hydrogen terminated silicon surface with mixtures of t-BOC protected amine and dodecene. Alternatively, the t-BOC protected amine surfaces were partially deprotected by exposure to 25% trifluoroacetic acid for a variety of times.

Example 9
Surface Density Measurements

The number of molecules hybridized to the surface was determined using a previously published procedure. (28, 44) Oligonucleotides were immobilized on the surface and their fluorescent complements were allowed to hybridize as before. The surface was imaged and the area of fluorescence was measured. The surface was then placed in 800 µL of 90° C. water in a microfuge tube for 15 minutes to completely denature the duplexes. The surface was then rinsed twice with 200 mL water, which were quantitatively eluted into the original 800 mL. The surfaces were rescanned to ensure complete denaturation had occurred. The volume of water containing the complements was then reduced to about 10 mL by vacuum centrifugation and loaded on one lane of a polyacrylamide gel, while known amounts of fluorescent oligonucleotide standard were loaded in the other lanes. After electrophoresis the gel was imaged and the amount of fluorescent oligonucleotide eluted from the surface was calculated by reference to a standard curve developed from the known samples. Using this method, the density of hybridized molecules was found to be approximately 2.3' $10^{12}$ molecules/cm².

Example 10
Stability Measurements

Stability of this surface chemistry was demonstrated both with direct monitoring of immobilized fluorescent oligonucleotides and through repeated hybridizations. For direct monitoring, oligonucleotides labeled with fluorescein on their 5' ends and a thiol group on their 3' ends (SEQ. ID. NO:3) were covalently attached to the activated surface. After covalent attachment was allowed to occur, the surface was stored overnight in HB at 27° C. The fluorescence intensity of the surface was then measured by scanning on the FluorImager, after which the surface was returned to the buffer for 1 hour at 27° C. The surface was then rescanned and the fluorescence measured. Subsequent scans were performed every hour for a total of 10 hours while the surface was stored in the buffer at 27° C. Exposure to light was kept to a minimum throughout this experiment.

The stability of the surface with respect to hybridization conditions was also tested. Fluorescein labeled SEQ. ID. NO:3 as well as the non-fluorescent SEQ. ID. NO:1 were covalently attached to two different areas of the surface. The DNA modified surface was exposed to the fluorescently tagged complement of SEQ. ID. NO:1 for 20 minutes and hybridization was allowed to occur, The hybridized surface was then scanned on the FluorImager and the fluorescence signals of both DNA modified areas were quantitatively measured. The hybridized surface was placed in 8.3M urea to denature the duplex strands then rescanned to ensure the fluorescent complements were removed. The surface was subjected to 15 such cycles of hybridization, scanning, denaturing, rescanning and rehybridization (see results).

BIBLIOGRAPHY

1. Rasmussen, S. R., Larsen, M. R. and Rasmussen, S. E. (1991) *Analytical Biochemistry*, 198, 138–142.
2. Yang, M., McGovern, M. E. and Thompson, M. (1997) *Analytica Chimica Acta*, 346, 259–275.
3. Yang, M., Kong, R. Y. C., Kazmi, M. and Leung, K. C. (1998) *Chemistry Letters*, 257–258.
4. Service, R. F. (1998) *Science*, 282, 396–399.
5. Kremski, J. N., Wooters, J. L., Dougherty, J. P., Meyers, R. E., Collins, M. and Brown, E. L. (1987) *Nucleic Acids Research*, 15, 2891–2909.
6. Broude, N. E., Sano, T., Smith, C. L. and Cantor, C. R. (1994) *Proc. Natl Acad. Sci. USA*, 91, 3072–3076.
7. Liu, Q., Frutos, A. G., Thiel, A. J., Corn, R. M. and Smith, L. M. (1998) *Journal of Computational Biology*, 5, 269–278.
8. Henke, L., Piunno, P. A. E., McClure, A. C. and Krull, U. J. (1997) *Analytica Chimica Acta*, 344, 201–213.
9. Maskos, U. and Southern, E. M. (1992) *Nucleic Acids Research*, 20, 1679–1684.
10. Guo, Z., Guilfoyle, R. A., Thiel, A. J., Wang, R. and Smith, L. M. (1994) *Nucleic Acids Research*, 22, 5456–5465.

11. Chrisey, L. A., Lee, G. and O'Ferrall, C. E. (1996) *Nucleic Acids Research*, 25, 3031–3039.
12. Smith, L. M., Corn, R. M., Condon, A. E., Lagally, M. G., Frutos, A. G., Liu, Q. and Thiel, A. J. (1998) *Journal of Computational Biology,*, 5, 255–267.
13. Bamdad, S. (1998) *Biophysical Journal*, 75, 1997–2003.
14. Parinov, X., Barsky, V., Gennady, Y., Kirillov, E., Timofeev, E., Belgovkiy, A. and Mirzabekov, A. (1996) *Nucleic Acids Research*, 24, 2889–3004.
15. Livache, T., Fouque, B., Roget, A., Marchand, J., Bidan, G., Teoule, R. and Mathis, G. (1998) *Analytical Biochemistry*, 255, 188–194.
16. Southern, E. M., Case-Green, S. C., Johnson, M., Mir, K. U., Wang, L. and Williams, J. C. (1994) *Nucleic Acids Research*, 22, 1368–1373.
17. Frutos, A. G., Liu, Q., Thiel, A. J., Sanner, A. M. W., Condon, A. E., Smith, L. M. and Corn, R. M. (1997) *Nucleic Acids Research*, 25, 4748–4757.
18. Shchepinov, M. S., Case-Green, S. C. and Southern, E. M. (1997) *Nucleic Acids Research*, 25, 1155–1161.
19. Wagner, P., Nock, S., Spudich, J. A., Volkmuth, W. D., Chu, S., Cicero, R. L., Wade, C. P., Linford, M. R. and Chidsey, C. E. D. (1997) *Journal of Structural Biology*, 119, 189–201.
20. Arnold, B. A., Hepler, R. W. and Keller, P. M. (1998) *BioTechniques*, 25, 106–110.
21. Lund, V., Schmid, R., Rickwood, D. and Hornes, E. (1988) *Nucleic Acids Research*, 16, 10860–10878.
22. Millan, K. M., Spurmanis, A. J. and Mikkelsen, S. R. (1992) *Electroanalysis*, 4, 929–932.
23. Pang, D., Zhang, M., Wang, Z., Qi, Y., Cheng, J. and Liu, Z. (1996) *Journal of Electroanalytical Chemistry*, 403, 183–188.
24. Wang, J., Fernandes, J. R. and Kubota, L. T. (1998) *Analytical Chemistry*, 70, 3699–3702.
25. Millan, K. M. and Mikkelsen, S. R. (1993) *Analytical Chemistry*, 65, 2317–2323.
26. Zhao, Y., Pang, D., Wang, Z., Cheng, J. and Qi, Y. (1997) *Journal of Electroanalytical Chemistry*, 431, 203–209.
27. Hashimoto, K., Ito, K. and Ishimori, Y. (1994) *Analytical Chemistry*, 66, 3830–3833.
28. Frutos, A. G., Smith, L. M. and Corn, R. M. (1998) *Journal of the American Chemical Society*, 120(40), 10277–10282.
29. Piunno, P. A. E., Krull, U. J., Hudson, R. H. E., Damha, M. J. and Cohen, H. (1994) *Analytica Chimica Acta*, 288, 205–214.
30. Lamture, J. B., Beattie, K. L., Burke, B. E., Eggers, M. D., Ehrlich, D. J., Fowler, R., Hollis, M. A., Kosicki, B. B., Reich, R. K., Smith, S. R., Varma, R. S. and Hogan, M. E. (1994) *Nucleic Acids Research*, 22, 2121–2125.
31. Souteyrand, E., Cloarec, J. P., Martin, J. R., Wilson, C., Lawrence, I., Mikkelsen, S. and Lawrence, M. F. (1997) *Journal of Physical Chemistry B*, 101, 2980–2985.
32. Rogers, Y., Jiang-Baucom, P., Huang, Z., Bogdanov, V., Anderson, S. and Boyce-Jacino, M. T. (1999) *Analytical Biochemistry*, 266, 23–30.
33. Vo-Dinh, T., Alarie, J. P., Isola, N., Landis, D., Wintenberg, A. L. and Ericson, M. N. (1999) *Analytical Chemistry*, 71, 358–363.
34. Ulman, A. (1996) *Chemical Reviews*, 96, 1533–1554.
35. Waddell, T. G., Leyden, D. E. and DeBello, M. T. (1981) *Journal of the American Chemical Society*, 103, 5303–5307.
36. Linford, M. R., Fenter, P., Eisenberger, P. M. and Chidsey, C. E. D. (1995) *Journal of the American Chemical Society*, 117, 3145–3155.
37. Buriak, J. M. (1999) *Chem. Commun.*, 1051–1060.
38. Stewart, M. P. and Buriak, J. M. (1998) *Angew. Chem. Int. Ed.*, 37(23), 3257–3260.
39. Sieval, A. B., Demirel, A. L., Nissink, J. W. M., Linford, M. R., van der Mass, J. H., de Jeu, W. H., Zuilhof, H. and Sudholter, E. J. R. (1998) *Langmuir*, 14, 1759–1768.
40. Terry, J., Linford, M. R., Wigren, C., Cao, R., Pianetta, P. and Chidsey, C. E. D. (1999) *Journal of Applied Physics*, 85, 213–221.
41. Zhao, X. and Hamers, R. (1999) *In Preparation.*
42. Hamers, R. J., Hovis, J. S., Seung, L., Liu, H. and Shan, J. (1997) *The Journal of Physical Chemistry B*, 101, 1489–1492.
43. Effenberger, F., Gotz, G., Bidlingmaier, B. and Wezstein, M. (1998) *Angew. Chem. Int. Ed.*, 37(18), 2462–2464.
44. Strother, T., Cai, W., Zhao, X., Hamers, R. J. and Smith, L. M. (2000) *Journal of the American Chemical Society*, 122(6), 1205–1209.
45. Connolly, B. A. and Rider, P. (1985) *Nucleic Acids Research*, 13, 4485–4501.
46. User Guide to DNA Modification (1996) Glen Research Corporation, Sterling, Va.
47. Pfister, J. R. and Wymann, W. E. (1983) *Synthesis*, 38–40.
48. Newman, H. (1965) *Journal of Organic Chemistry*, 30, 1287–1288.
49. Tarbell, D. S., Yamamoto, Y. and Pope, B. M. (1972) *Proc. Nat. Acad. Sci. USA*, 69(3), 730–732.
50. Greene, T. W. and Wuts, P. G. M. (1999) Protective Groups in Organic Synthesis, John Wiley & Sons, INC., New York.
51. Brockman, J. M., Frutos, A. B. and Corn, R. M. (1999) *Journal of the American Chemical Society*, 121(35), 8044–8051.
52. M'Saad, H., Michel, J., Lappe, J. J., and Kimerling, L. C. (1994) *Journal of Electronic Materials*, 23(5), 487–491
53. Stephens, A. W. and Green, M. A. (1997) *Solar Energy Materials and Solar Cells*, 45, 255–265

What is claimed is:

1. A method of creating modified silicon surfaces comprising:
   (a) contacting an unoxidized silicon substrate with a bromine- or iodine-containing reactant to form an unoxidized, bromine- or iodine-terminated silicon substrate; and then
   (b) reacting a straight, branched, or cyclic alkene having a substitutent thereon with the bromine- or iodine-terminated silicon substrate of step (a) to yield a modified substrate having bonded directly thereto, in the absence of any intervening oxygen atoms, substituted moieties.

2. The method of claim 1, wherein in step (a) the substrate is contacted with a reagent comprising a solution of bromine or iodine.

3. The method of claim 2, wherein in step (a) the substrate is contacted with a reagent comprising a solution of bromine or iodine in benzene.

4. The method of claim 1, wherein in step (b) the reaction is photoinitiated.

5. The method of claim 4, wherein in step (b) the reaction is photoinitiated using visible light.

6. The method of claim 4, wherein in step (b) the reaction is photoinitiated using visible light having a wavelength of 514 nm.

7. The method of claim 4, wherein in step (b) the reaction is photoinitiated at pre-determined locations on the substrate by selective exposure of the substrate to visible light.

8. The method of claim 1, wherein in step (b) the substrate is reacted with a substituted alkene having a substituent selected from the group consisting of amino, carboxy, and thio.

9. The method of claim 8, wherein in step (b) the substitutent on the alkene is protected.

10. The method of claim 8, wherein in step (b) the substrate is reacted with a protected aminoalkene.

11. The method of claim 10, wherein in step (b) the substrate is reacted with t-BOC-protected 10-aminodec-1-ene.

12. The method of claim 8, wherein in step (b) the substrate is reacted with an α-alkene having a substituent disposed on an ω carbon of the α-alkene.

13. The method of claim 12, wherein in step (b) the substrate is reacted with an α-alkene having an amino substituent disposed on an ω carbon of the α-alkene.

14. The method of claim 1, further comprising, after step (b):
   (c) attaching molecules to the substituted alkyl moieties bonded to the substrate, thereby yielding a modified surface having the molecules immobilized thereon.

15. The method of claim 14, wherein in step (c) molecules selected from the group consisting of DNA, RNA, and combinations thereof, are attached to the substituted alkyl moieties.

16. The method of claim 14, wherein in step (c) a crosslinker is attached to the substituted alkyl moieties.

17. The method of claim 16, wherein the crosslinker is a heterobifunctional crosslinker.

18. The method of claim 16, wherein the crosslinker is SSMCC.

19. The method of claim 16, further comprising, after step (c):
   (d) attaching molecules to the crosslinker attached to the substituted alkyl moieties.

20. The method of claim 19, wherein in step (d) molecules selected from the group consisting of DNA, RNA, and combinations thereof, are attached to the substituted alkyl moieties.

21. A method of creating modified surfaces on unoxidized silicon surfaces comprising:
   (a) reacting iodine with an unoxidized silicon substrate to form an iodine-terminated silicon substrate; then
   (b) placing an amino-, carboxy-, or thiol-modified alkene upon the iodine-terminated silicon substrate; then
   (c) exposing the amino-, carboxy-, or thiol-modified alkene of step (b) to visible light such that the iodine is removed from the substrate and the amino-, carboxy-, or thiol-modified alkene reacts with the substrate to yield a surface of amino-, carboxy-, or thiol-modified alkane molecules covalently bonded to the substrate in the absence of any intervening oxygen molecules; then
   (d) reacting the modified alkane molecules of step (c) with a crosslinker, whereby the crosslinker is attached to the modified alkane molecules; and then
   (e) attaching molecules to the crosslinker of step (d), thereby yielding a surface of molecules immobilized on the substrate.

22. The method of claim 21, wherein in step (b) a protected amino-, carboxy-, or thiol-modified alkene is placed upon the iodine-terminated substrate; and further comprising, after step (c) and prior to step (d), deprotecting the protected amino-, carboxy-, or thiol-modified alkene.

23. The method of claim 21, wherein in step (d) the crosslinker is a heterobifunctional crosslinker.

24. The method of claim 21, wherein the crosslinker is SSMCC.

25. The method of claim 21, wherein in step (e) molecules selected from the group consisting of DNA, RNA, and combinations thereof, are attached to the substituted alkyl moieties.

* * * * *

SEQUENCE LISTING

<160> NUMBER OF SEQ ID NOS: 3

<210> SEQ ID NO 1
<211> LENGTH: 31
<212> TYPE: DNA
<213> ORGANISM: ARTIFICIAL
<220> FEATURE:

```
<223> OTHER INFORMATION: Oligonucleotide sequence ID. NOs. 1, 2, & 3
      comprise a 15-mer dT spacer sequence at the 5' end and a
      specific 16-mer sequence at the 3' end complementary to an
      experimental substrate.

<400> SEQUENCE: 1
tttttttttt tttttaacga tcgagctgca a                              31

<210> SEQ ID NO 2
<211> LENGTH: 31
<212> TYPE: DNA
<213> ORGANISM: Artificial
<220> FEATURE:
<223> OTHER INFORMATION: Oligonucleotide sequence ID. NOs. 1, 2, & 3
      comprise a 15-mer dT spacer sequence at the 5' end and a
      specific 16-mer sequence at the 3' end complementary to an
      experimental substrate.

<400> SEQUENCE: 2
tttttttttt tttttaacga tgcaggagca a                              31

<210> SEQ ID NO 3
<211> LENGTH: 31
<212> TYPE: DNA
<213> ORGANISM: Artificial
<220> FEATURE:
<223> OTHER INFORMATION: Oligonucleotide sequence ID. NOs. 1, 2, & 3
      comprise a 15-mer dT spacer sequence at the 5' end and a
      specific 16-mer sequence at the 3' end complementary to an
      experimental substrate.

<400> SEQUENCE: 3
tttttttttt tttttaacga tcgagctgca a                              31
```